United States Patent [19]
Caldwell

[11] Patent Number: 5,503,962
[45] Date of Patent: Apr. 2, 1996

[54] CHEMICAL-MECHANICAL ALIGNMENT MARK AND METHOD OF FABRICATION

[75] Inventor: Roger F. Caldwell, Milpitas, Calif.

[73] Assignee: Cypress Semiconductor Corporation, San Jose, Calif.

[21] Appl. No.: 275,778

[22] Filed: Jul. 15, 1994

[51] Int. Cl.$^6$ ............... H01L 21/302; H01L 21/304
[52] U.S. Cl. ............ 430/317; 430/327; 148/DIG. 102; 156/625; 437/924; 216/39
[58] Field of Search .................. 156/625; 437/924; 430/327, 311, 313, 316, 317; 427/96; 148/DIG. 102

[56] References Cited

U.S. PATENT DOCUMENTS

| | | |
|---|---|---|
| 4,573,257 | 3/1986 | Hulseweh .............................. 437/924 |
| 5,294,556 | 3/1994 | Kawamura ............................. 437/924 |
| 5,316,966 | 5/1994 | Van Der Plas et al. ................. 437/924 |

*Primary Examiner*—Charles L. Bowers, Jr.
*Assistant Examiner*—Christopher G. Young
*Attorney, Agent, or Firm*—Blakely, Sokoloff, Taylor & Zafman

[57] ABSTRACT

A method for forming an alignment mark during semiconductor device manufacturing. A first alignment mark having a first step height is formed in a semiconductor substrate. An interlayer dielectric is formed over the alignment mark and planarized to a first thickness. During contact/via etch an opening is formed through the first dielectric layer away from the first alignment mark. The opening is then filled with a material until the material in the bottom of the opening has a thickness less than thickness of the planarized dielectric layer.

23 Claims, 11 Drawing Sheets

IC AREA 202

BLANK STEPPING FIELD 204

5,503,962

CHEMICAL-MECHANICAL ALIGNMENT MARK AND METHOD OF FABRICATION

BACKGROUND OF THE INVENTION

1. Field of the Invention

The present invention relates to the field of semiconductor processing, and more specifically to a method of forming an alignment mark during the fabrication of semiconductor devices.

2. Description of Related Art

In semiconductor integrated circuit (IC) fabrication processes, multiple layers of conductors and insulators are patterned and built one upon the other to construct the IC. During the fabrication process it is critical to align each subsequent layer to a previous layer with great precision in order to preserve circuit continuity. The degree of alignment precision is often a major factor which determines the manufacturability, yield, and profit of a process.

The alignment of one layer to the next is typically accomplished in a tool called a wafer stepper. The purpose of the stepper is to transfer a desired pattern situated on a reticle into a layer formed on the semiconductor wafer. (The reticle typically contains a magnified (5×) version of the pattern to be generated.) As is well known in the art, in a typical alignment operation, a semiconductor wafer, having an alignment mark, is coated with a transparent photosensitive material (generally referred to as photoresist). The wafer is then loaded into the wafer stepper tool. The stepper uses the alignment mark on the wafer as a reference point in adjusting the position of the reticle over the wafer to precisely align the reticle to the previous layer on the wafer.

Generally, a stepper utilizes a laser beam with a fixed wavelength to sense the position of the alignment mark on the wafer. The laser beam in the stepper is bounced off of the alignment mark on the semiconductor wafer surface to create a slonal pattern of laser light. The defraction from the alignment mark is reflected back to sensing devices in the stepper and is used as a signal to measure the exact position of the alignment mark. The quality of the defractive light from the alignment mark is a direct result of the structure of the alignment mark (i.e., a result of the materials and dimensions of the mark).

General problems associated with present techniques of generating alignment marks and aligning wafers are illustrated in FIGS. 1a–1g. As shown in FIG. 1a, individual integrated circuits 122 are generated in each stepping field of the stepper. Generally there are two blank stepping fields 120 which are skipped during alignment and exposure of the various reticles used to pattern the wafer. A very small rectangular alignment mark 102 is typically formed near the center of each blank stepping field 120. Alignment mark 102 is very small in relationship to blank stepping field 120.

An alignment mark 102 is generally formed by etching a control distance into the semiconductor wafer 100, as shown in FIG. 1b. The etching step forms a step height 104 in the wafer 100. The step height 104 acts as the alignment mark. Step height 104 of alignment mark 102 is generally chosen to be some multiple, typically ¼, of the wavelength of the laser light used by the stepper to conduct alignment. By utilizing an alignment mark which is a ¼ multiple of the laser wavelength, the signal to noise ratio of the laser defraction is optimized, resulting in optimum alignment precision.

Next, as shown as FIG. 1c, subsequent layers used to form the integrated circuit are grown and deposited over the wafer. For example, field isolation regions 106, polysilicon conductors 108, and interlayer dielectrics (ILDs) 110 are grown and deposited respectively over the semiconductor wafer. Although the original alignment mark 102 is covered by subsequent layers, the step height 104 and the therefore, the alignment mark 102, is replicated in the subsequently deposited layers. The replicated alignment marks are used for aligning and patterning the subsequent layers. That is, as more layers are added to the IC, the step height of the alignment mark is propagated upward or is "built upward" with subsequent layers. The step height of the alignment mark is therefore preserved in subsequent layers so that alignment of subsequent layer can be accomplished.

A problem with building up the alignment mark is that it is incompatible with global planarization techniques, such as chemical-mechanical polishing. As more and more layers are added to the IC process, and circuit density increases, the requirement to planarize the IC topography at intermediate steps in the process becomes essential. It is important to planarize surfaces of multilevel integrated circuits because nonplanar surfaces interfere with the optical resolution of subsequent photolithography processing steps. This makes it extremely difficult to print high resolution lines. Additionally, nonplanar surface topographies can effect subsequently formed metal layers. If a step height is too large, there is a serious danger that open circuits will be formed in later metal layers. It has been found that the best way to planarize the IC topography is to planarize the ILDs and to use a global planarization technique, such as chemical-mechanical polishing. Global planarization techniques planarize the entire wafer surface and make the surface essentially flat. Unfortunately, if ILD 110 is globally planarized, not only is the ILD 110 over the IC area 100 planarized, but so is the ILD 110 over the alignment mark. The global planarization technique, therefore, removes the alignment mark replicated in ILD 104, as shown in FIG. 1d.

Although the alignment mark has been removed during the global planarization step, the next process step, which is typically a contact etch step, can still proceed because the alignment mark 104 is visible through transparent ILD 110. That is, the contact etch pattern step can be aligned to the step height formed in polysilicon layer 108.

The next step in the fabrication of ICs typically is the formation of metal interconnects. As shown in FIG. 1e, a metal layer 112 is blanket deposited over ILD 110 and into contact 117, so that an electrical connection can be made with the polysilicon layer 108. Because metal layers are opaque, the step height 104 of alignment mark 102 formed in polysilicon layer 108 is invisible to the stepper laser. Without a visible alignment mark or an alignment mark replicated in metal layer 112, it is impossible to align the reticle to generate the metal interconnection pattern.

One solution to the planarized alignment mark problem is an "open frame" process. In an open frame process, after contact alignment, a separate reticle (an open frame reticle) is used to expose the area immediately surrounding alignment mark 102. ILD 110 over alignment mark 102 can then be etched away during the contact etch. Metal layer 112 can then be formed over uncovered alignment mark 102 formed in polysilicon layer 108, as shown in FIG. 1f. Alignment mark 102 replicated in metal layer 112 can then be used to align the reticle to generate of the metal interconnect pattern.

The "open frame" solution works fine in processes that require only one global planarization step. Many IC processes, however, require two global planarization steps. When a second global planarization step is required, it is not feasible to repeat the open frame alignment etch, due to the increased thickness of the dielectric material over the alignment mark. That is after the second global planarization, the depth of the dielectric material over the alignment mark is increased by the depth of the original open frame etch in comparison to the relevant structures on the IC. As a result, if one were to use a second open frame etch, chances are the relevant structure on the IC could not withstand the additional etching required to open the alignment mark.

Another solution to the planarized alignment mark problem, as shown in FIG. 1g, is to form a second completely independent alignment mark in ILD 110. In this process, after global planarization and contact formation, an exclusive masking and etching step is used to form a new alignment mark in ILD 110. This process requires considerable additional processing which adds no new value to the fabricated IC. This technique, therefore, is cost prohibitive.

Thus, what is required is a method of fabricating an alignment mark during multilayer semiconductor processes which is compatible with global planarization techniques, such as chemical-mechanical polishing (CMP) and which does not add additional cost or complexity to the fabrication process.

SUMMARY OF THE INVENTION

A method of forming a chemical-mechanical alignment mark during the fabrication of an integrated circuit (IC) is described. First, an alignment mark having a first step height is formed in a silicon substrate. A polysilicon layer is then formed over the substrate, including the alignment mark. A dielectric layer is then formed over the polysilicon layer and planarized to a first thickness. An opening, having vertical sidewalls, is then etched through the dielectric layer to the polysilicon layer. Next, a conductive material comprising tungsten is conformily deposited over the dielectric layer and into the opening. The conductive material is deposited to a thickness less than the thickness of the planarized dielectric layer. The conductive material is then chemically-mechanically polished from the top surface of the dielectric layer to form a chemical-mechanical alignment mark in the conductive material in the opening wherein the chemical-mechanical alignment mark has a second step height.

DETAILED DESCRIPTION OF THE PRESENT INVENTION

The present invention describes a novel method for the formation of alignment marks during the processing of semiconductor wafers. In the following description numerous specific details are set forth, such as specific process steps, and materials, etc., in order to provide a thorough understanding of the present invention. However, it will be obvious to one skilled in the art, the present invention may be practiced without these specific details. In other instances, well-known semiconductor process steps, such as ion implantation and spacer formation, are not described in order to not unnecessarily obscure the present invention.

The present invention describes a method of forming an alignment mark during the processing of a semiconductor wafer into integrated circuits or devices. The present invention is most useful for those processes used to form advanced multilevel ultra-large scale integrated (ULSI) circuits where global planarization techniques, such as chemical-mechanical polishing, are utilized. The present invention is illustrated with respect to a specific exemplary portion of a semiconductor process. The present invention, however, is not intended to be limited to the specific example, process, or materials described herein and is applicable to all processes used to form modern high density, multilevel integrated circuits irrespective of the number of layers formed or materials used. Additionally, in the present invention a substrate, is a semiconductor substrate or wafer or portion thereof, such as, but not limited to, silicon and gallium arsenide, and is the material on which the described process act and layers formed.

Figure 1A:
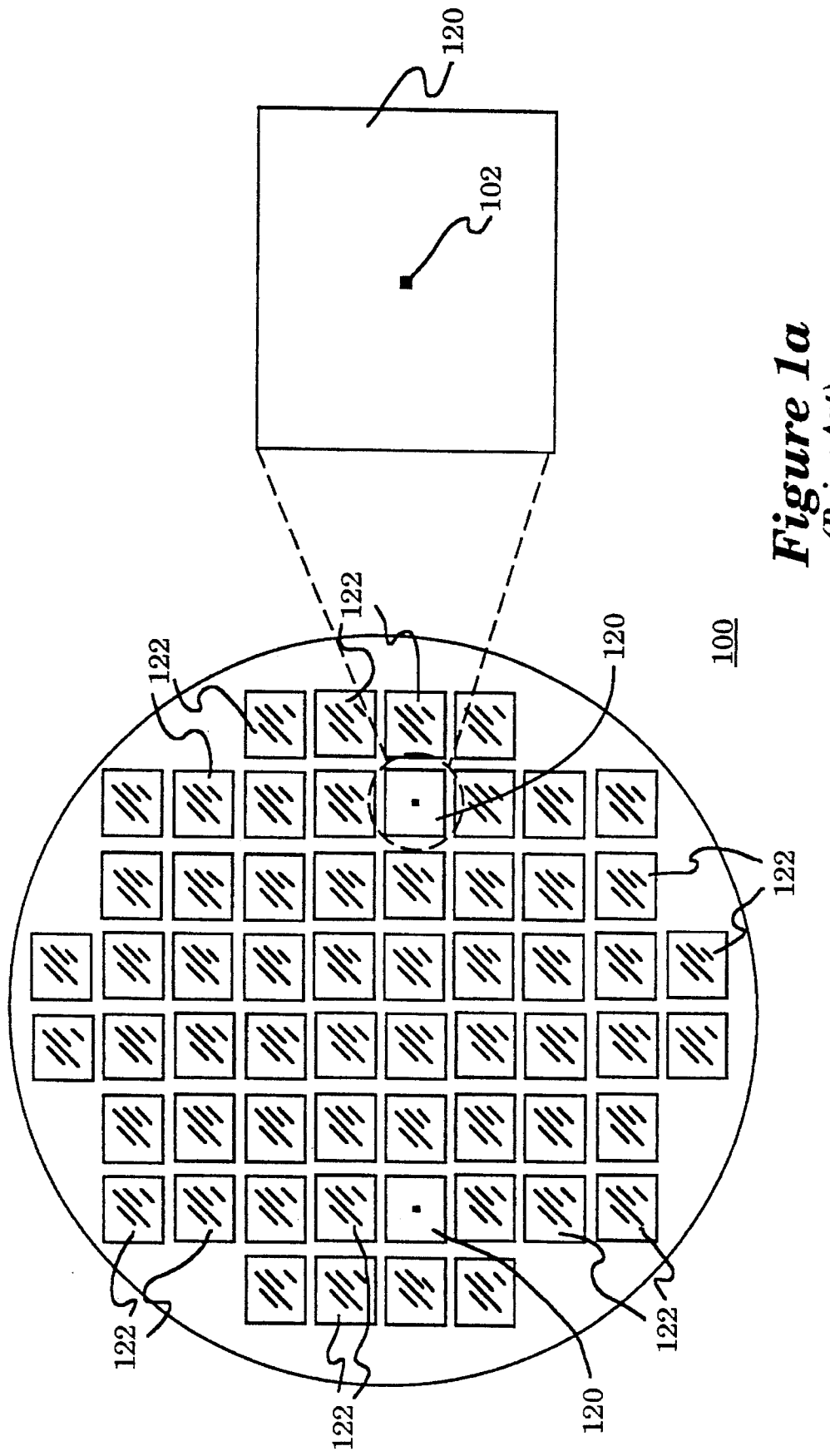
FIG. 1a is an illustration of an overhead view of a semiconductor wafer.
Figure 1B:
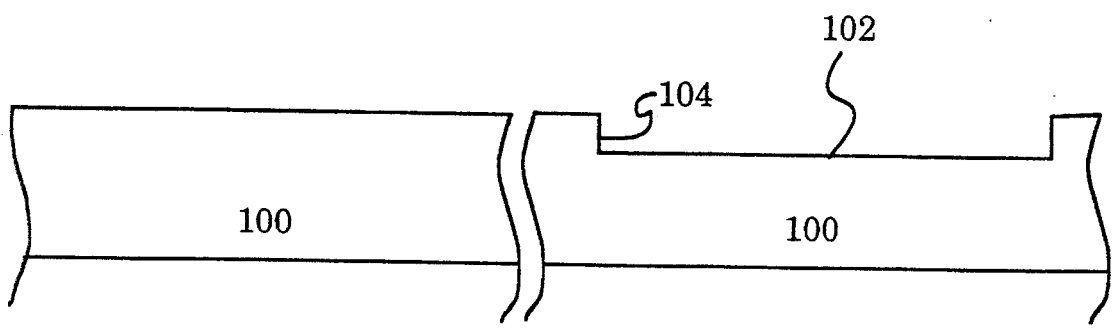
FIG. 1b is an illustration of a cross-sectional view showing the formation of an alignment mark in a semiconductor substrate.
Figure 1C:
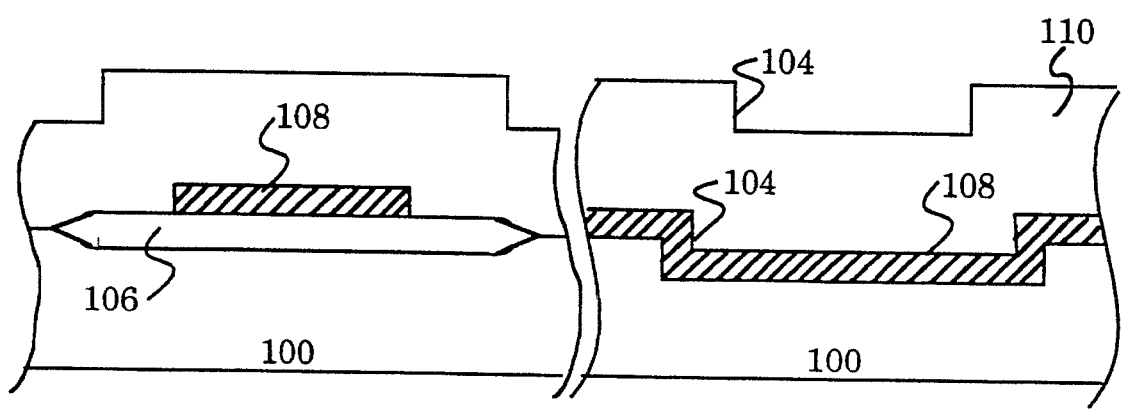
FIG. 1c is an illustration of a cross-sectional view showing the formation of subsequent layers of a semiconductor device on the substrate of FIG. 1b.
Figure 1D:
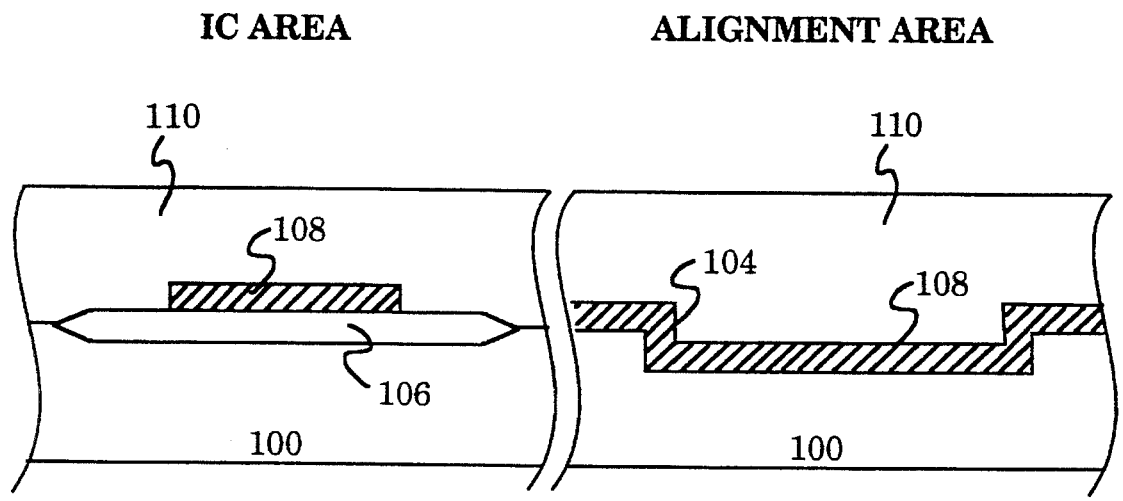
FIG. 1d is an illustration of a cross-sectional view showing a global planarization of the substrate of FIG. 1c.
Figure 1E:
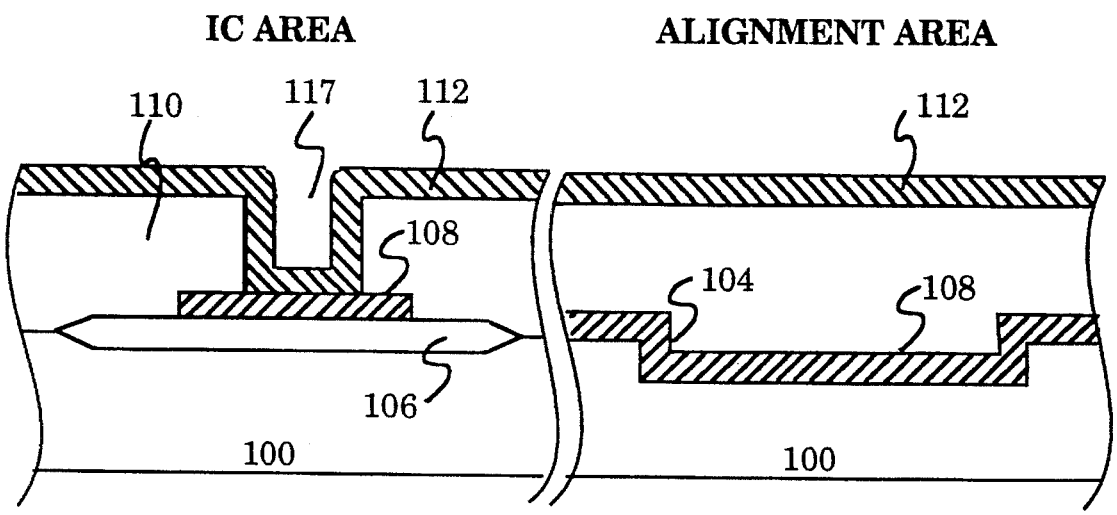
FIG. 1e is an illustration of a cross-sectional view showing the formation of a via hole and an opaque layer on the substrate of FIG. 1d.
Figure 1F:
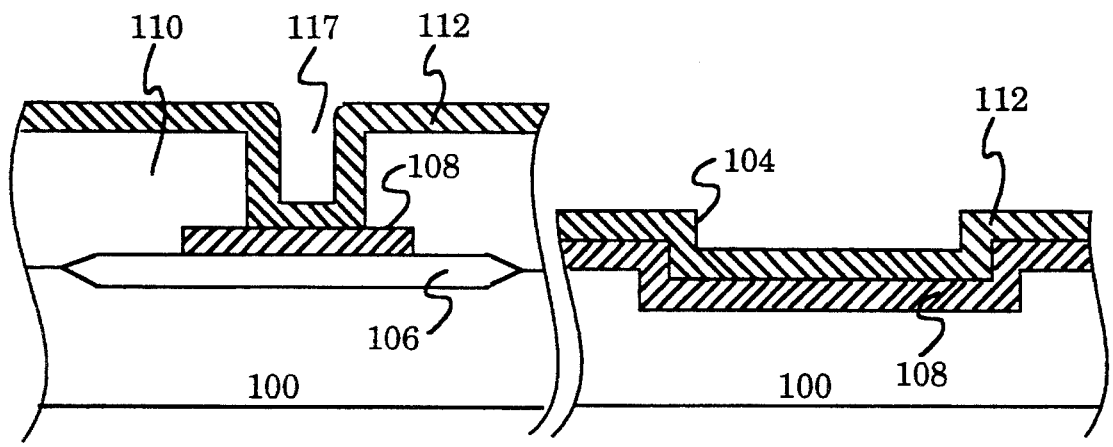
FIG. 1f is an illustration of a cross-sectional view showing the formation of openings and an opaque layer on the substrate of FIG. 1d.
Figure 1G:
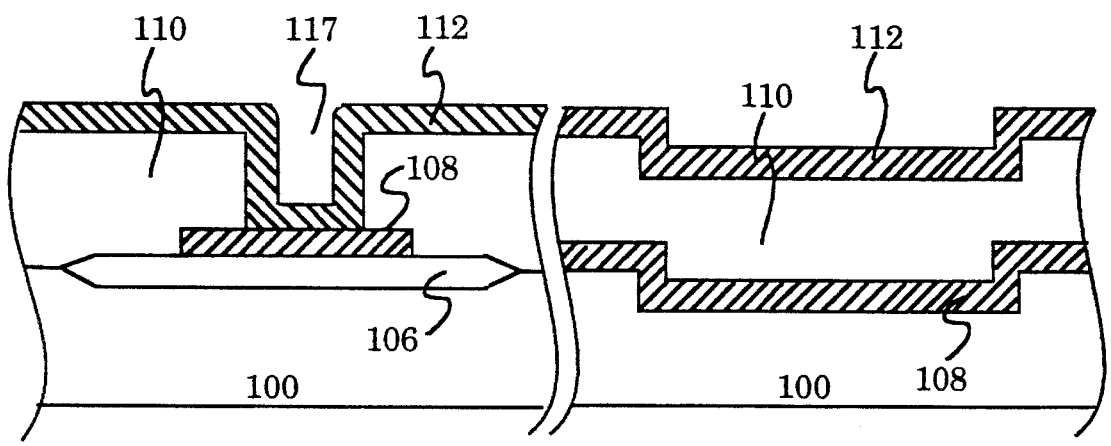
FIG. 1g is an illustration of a cross-sectional view showing the formation of an opening, a second independent alignment mark and an opaque layer on the substrate of FIG. 1d.
Figure 2A:
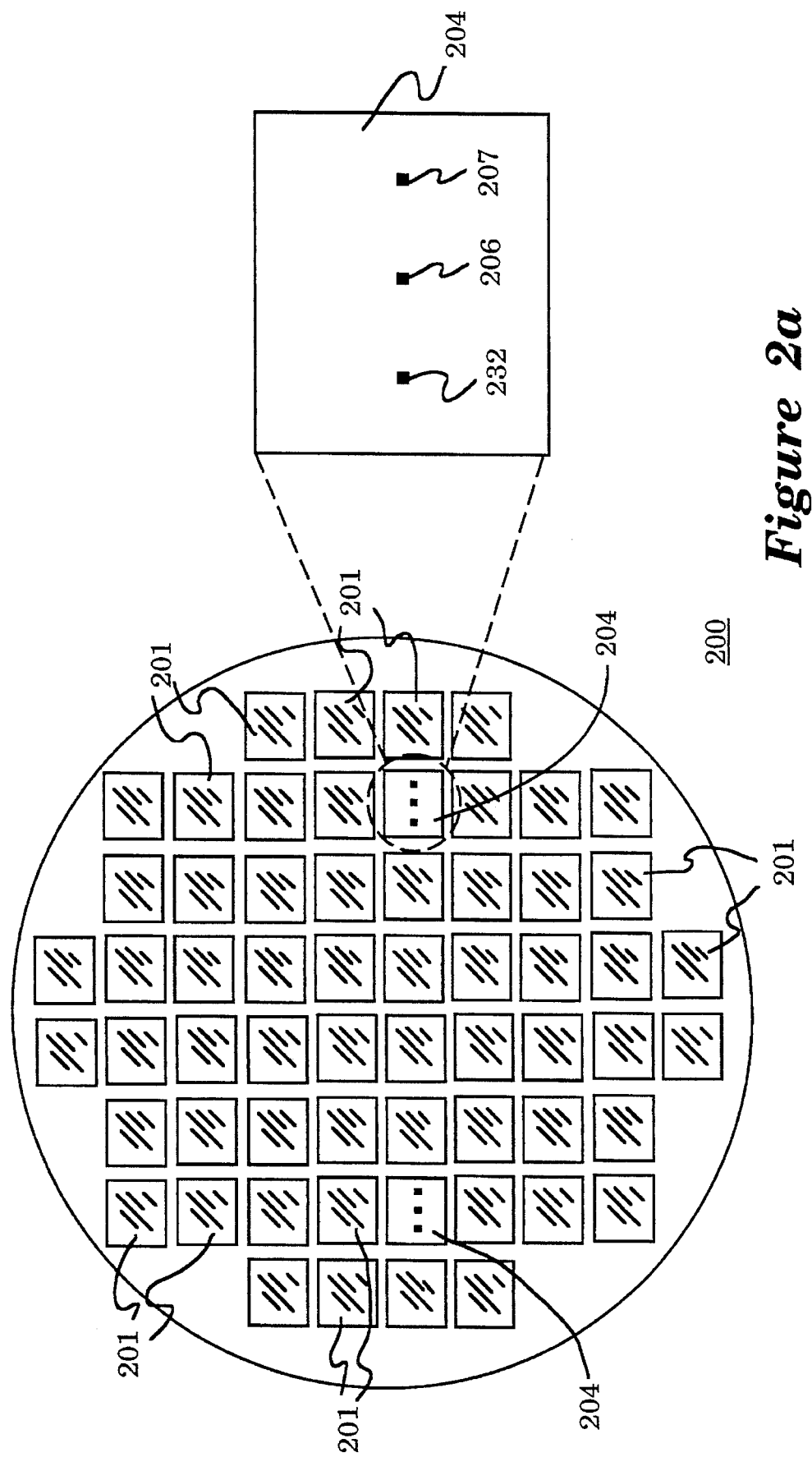
FIG. 2a is an illustration of an overhead view of a processed semiconductor substrate of the present invention.

FIG. 2a is an overhead illustration of a processed semiconductor substrate or wafer 200 of the present invention. Substrate 200 has a plurality of devices or integrated circuits 202, formed thereon. The integrated circuits 201 are formed on IC areas 202 of substrate 200. Each IC die lies within a stepping field of a stepper, such as the ASM 2500/40 by ASM Lithography, which generates the patterns on substrate 200 used to form the IC layers. Substrate 200 also has at least one, and typically two, blank stepping fields 204. A blank stepping field 204 is an area on substrate 200 which is skipped when the stepper forms patterns over the IC areas of substrate 200. No semiconductor devices or circuits are formed in blank stepping field 204.

Formed within each blank stepping field 204 of substrate 200, as shown in FIG. 2a, is a small rectangular alignment mark 206. Alignment mark 206 is used by the stepper to align reticles to substrate 200 during the semiconductor fabrication process. Alignment mark 206 is formed in a first layer of the semiconductor substrate. Additionally, according to the present invention, also formed in blank stepping field 204 is a second alignment mark (or a chemical-mechanical alignment mark) 232. Second alignment mark 232 is formed away from and in a different layer than alignment mark 206. Additional alignment marks 207 may also be formed in blank stepping field 204, according to the present invention. The number of additional alignment marks will vary depending upon specific process requirements, such as the number of level of interconnects and the number of planarization steps.

Figure 2B:
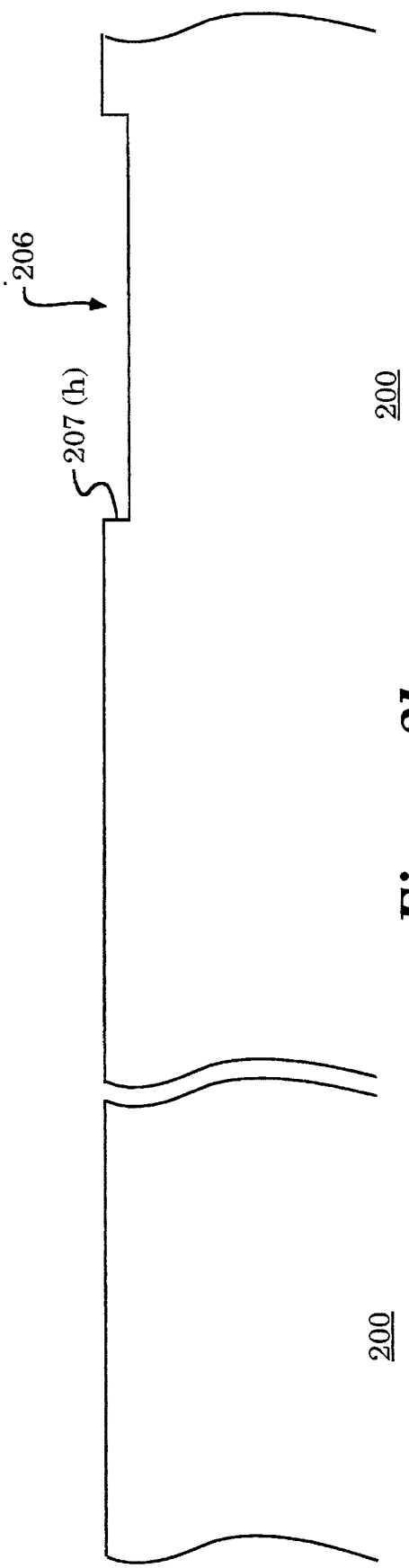
FIG. 2b is an illustration of a cross-sectional view showing the formation of an alignment mark in an unprocessed semiconductor substrate.

FIG. 2b is a cross section of a semiconductor substrate 200 before any device processing. FIG. 2b shows a portion of an IC area 202 where active devices are built and a portion of blank stepping field 204. One of the first steps in fabricating a semiconductor device is to form an alignment mark, such as alignment mark 206, in blank stepping field 204 of substrate 200. Alignment mark 206 has a fixed step height (h) 207 etched into substrate 200. The step height (h) 207 of alignment mark 206 is determined by the requirements of the actual stepper utilized. In the present invention a laser stepper such as the ASM 2500/40 is utilized. If such a stepper is utilized the step height (h) 207 of alignment mark 206 is chosen to be approximately a ¼ multiple of the wavelength of the light (laser) used by the stepper to align a reticle to substrate 200. The step height of alignment mark 206 is chosen so that the signal to noise ratio of light defraction is optimized, resulting in an optimum alignment precision. It is to be appreciated that other well-known steppers or photolithography machinery, including optical steppers, may be used if desired.

In the present invention, an alignment mark 206 having a preferred depth of approximately 1200Å and a width of approximately 8 microns is formed. Alignment mark 206 is preferably formed by masking and etching substrate 200 to a controlled depth. It is to be appreciated that other well-known techniques may be utilized to form alignment mark 206, such as, but not limited to, etching a film of a controlled thickness and stopping on the underlying layer, or etching a film which masks the growth of a subsequent layer.

Figure 2C:
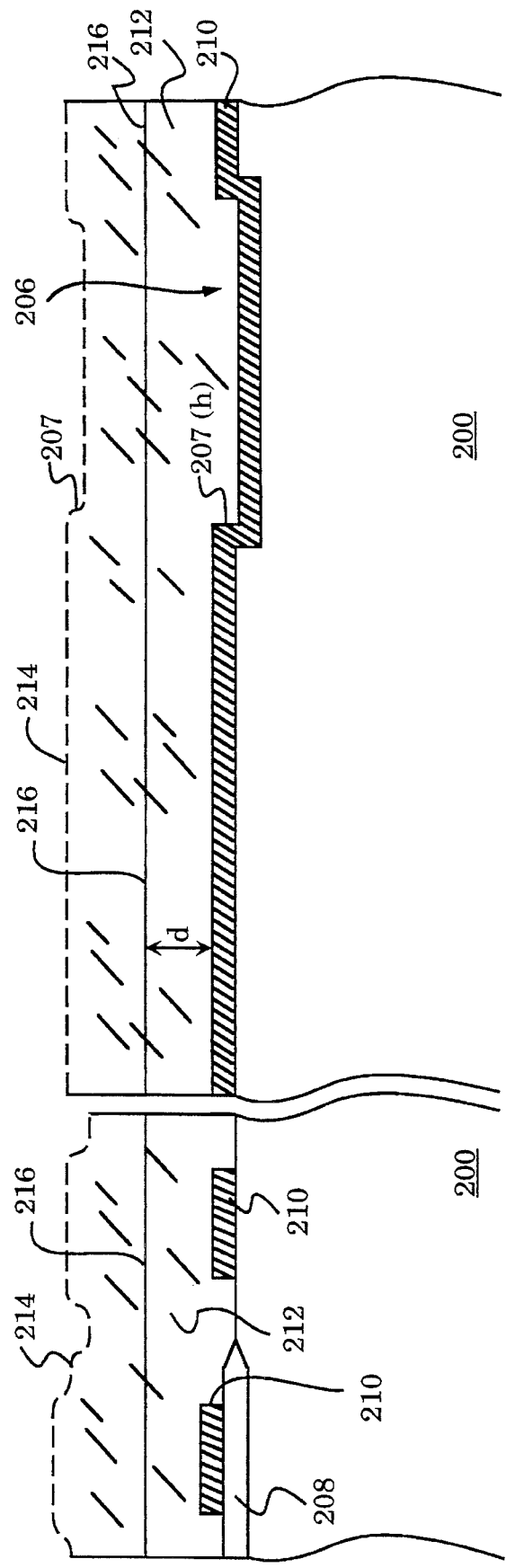
FIG. 2c is an illustration of a cross-sectional view showing the formation of a field oxide layer, a first interconnect layer, and a planarized dielectric layer over the semiconductor substrate of FIG. 2b.

The next step in the fabrication of a multilayer integrated circuit typically is the growth of a field oxide layer 208 in the IC areas 202 of substrate 200, as shown in FIG. 2c. Field oxides 208 electrically isolate the various components formed in IC area 202.

Next, a first interconnect layer or gate layer is formed. First interconnect layer 210 is preferably formed from polysilicon, but may be other conductive materials or composite materials, including but not limited to aluminum, tungsten, gold, copper, and their alloys. The first interconnect layer is blanket deposited with well-known techniques, such as chemical vapor deposition (CVD) or sputtering, over the entire surface of substrate 200. Alignment mark 206 and step height 207 are substantially replicated in first interconnect layer 210. After a photoresist layer (not shown) is formed over first interconnect layer 210, a first interconnect reticle is aligned over IC area 202 using alignment mark 206 replicated in first interconnect layer 210. The photoresist layer is then exposed and developed to define locations in polysilicon layer 210 where individual interconnect lines are to be formed. First interconnect layer 210 is then etched with well-known techniques to define a first level of interconnects or gates in IC area 202.

Next, a thick interlayer dielectric (ILD) 212 is blanket deposited over the entire substrate surface with well-known techniques, such as CVD. The surface topography of ILD 212 is initially non-planar 214 and resembles the underlying surface topography. Although ILD 212 is preferably a single layer of silicon dioxide ($SiO_2$), ILD 212 may be a multilayer or composite ILD, including nitride layers, spin-on-glass layers, and doped and undoped $SiO_2$ layers, etc. What is important is to provide an ILD which can sufficiently isolate a subsequently formed conductive layer from first interconnect layer 210.

Next, according to the present invention, ILD 212 is globally planarized with well-known techniques to form a sufficiently flat surface 216, as shown in FIG. 2c. Preferably, a well-known chemical-mechanical polishing technique is used to planarize ILD 212. Other well-known techniques, however, may be utilized to planarize ILD 212. It is to be appreciated that although alignment mark 206 and step height 207 are initially replacated in ILD layer 212, they are removed during the planarization step. ILD layer 212 is planarized to a thickness (d) of about 8000 angstroms (Å) above first interconnect layer 210. It is important in the present invention to accurately planarize ILD 212 to a known predetermined thickness (d) in blank stepping field 204 where a new alignment mark will eventually be formed.

Figure 2D:
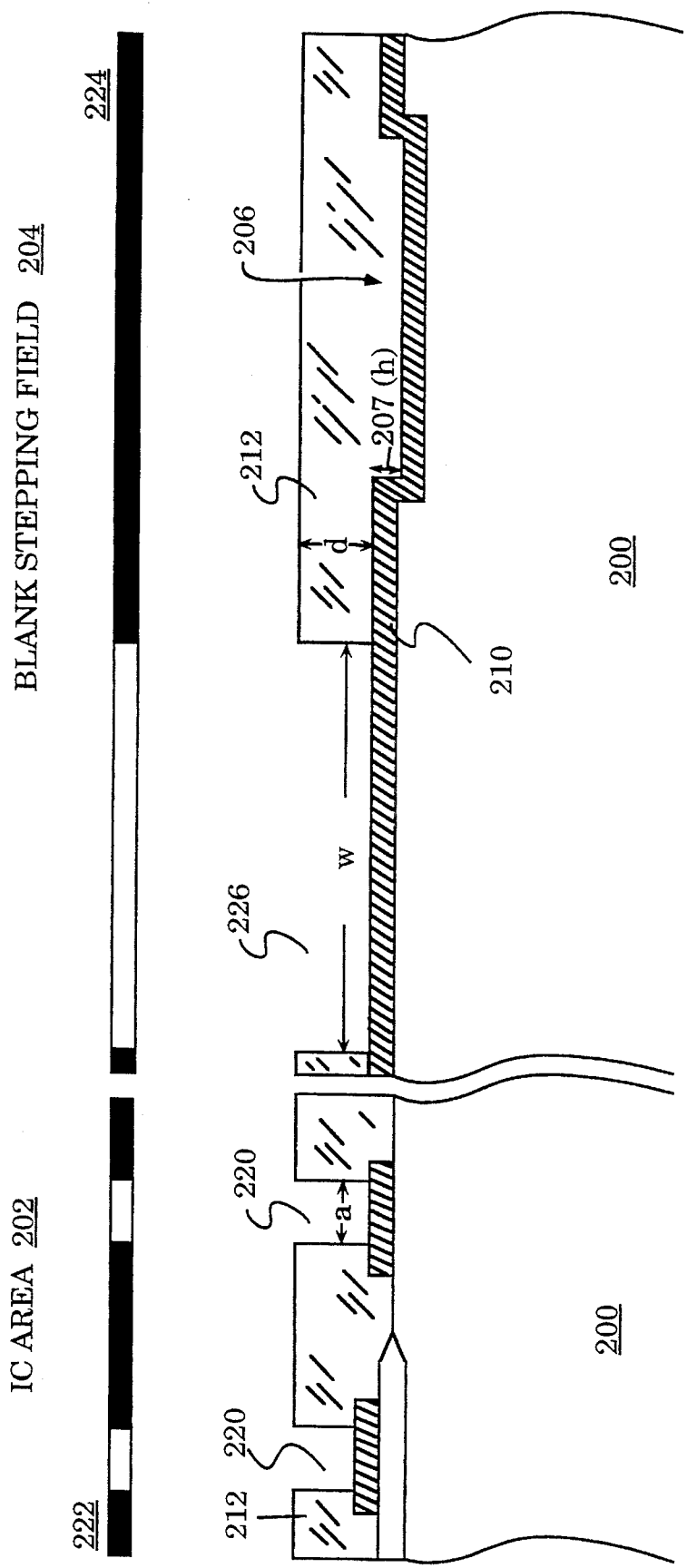
FIG. 2d is an illustration of a cross-sectional view showing the formation of contact openings and a chemical-mechanical alignment mark opening on the substrate of FIG. 2c.

The next step in the fabrication of a multilayer integrated circuit typically is the formation of via or contact openings 220 in IC area 202, as shown in FIG. 2d. To form contacts, a photoresist layer (not shown) is first formed over ILD 212. A contact reticle 222 is then aligned over IC area 202 using alignment mark 206 replicated in first interconnect layer 210. The photoresist is then exposed to define the locations where contacts 220 are to be formed.

Next, according to the present invention, the photoresist-layer formed over ILD 212 in blank stepping field 204 is exposed to define a location where a chemical-mechanical alignment mark opening 226 is to be formed. The photoresist layer over blank stepping field 204 can be patterned using a separate chemical-mechanical alignment mark reticle 224. Alternatively, the photoresist layer over blank stepping field 204 can be patterned by including an alignment mark on contact reticle 222 and "blading off" or exposing only that portion of contact reticle 222 which includes the alignment mark. Such a technique eliminates the need to change reticles in order to generate chemical-mechanical alignment mark opening 226.

After exposure of the photoresist layer over IC area 202 and blank stepping field 204 the photoresist layer is developed to define locations of contacts 220 and chemical-mechanical alignment mark opening 226. Next, ILD 226 is anisotropically etched to first interconnect layer 210 with well-known techniques, such as reactive ion etching (RIE) to form contact openings 220 and chemical-mechanical alignment mark opening 226 with substantially vertical sidewalls. Vertical sidewalls in contact opening 220 allow high density placement of contacts to first interconnect layer 210 in IC area 202. It is to be appreciated that chemical-mechanical alignment mark opening 226 is etched simultaneously with contact openings 220 and therefore, requires no additional etch step. Additionally, chemical-mechanical alignment mark opening 226 is etched to the same depth as the contact opening. In this way contact openings 220 need not be over etched in order to etch chemical-mechanical alignment mark opening 226. Over etching can decrease wafer throughput and increase the potential for reliability problems.

It is to be noted that the width (a) of widest contact opening 220 is significantly less than the width (w) of chemical-mechanical alignment opening 226. It is to be appreciated that according to the present invention, contact openings 220 must have an aspect ratio of at least 1:2 (i.e., a<2d).

Figure 2E:
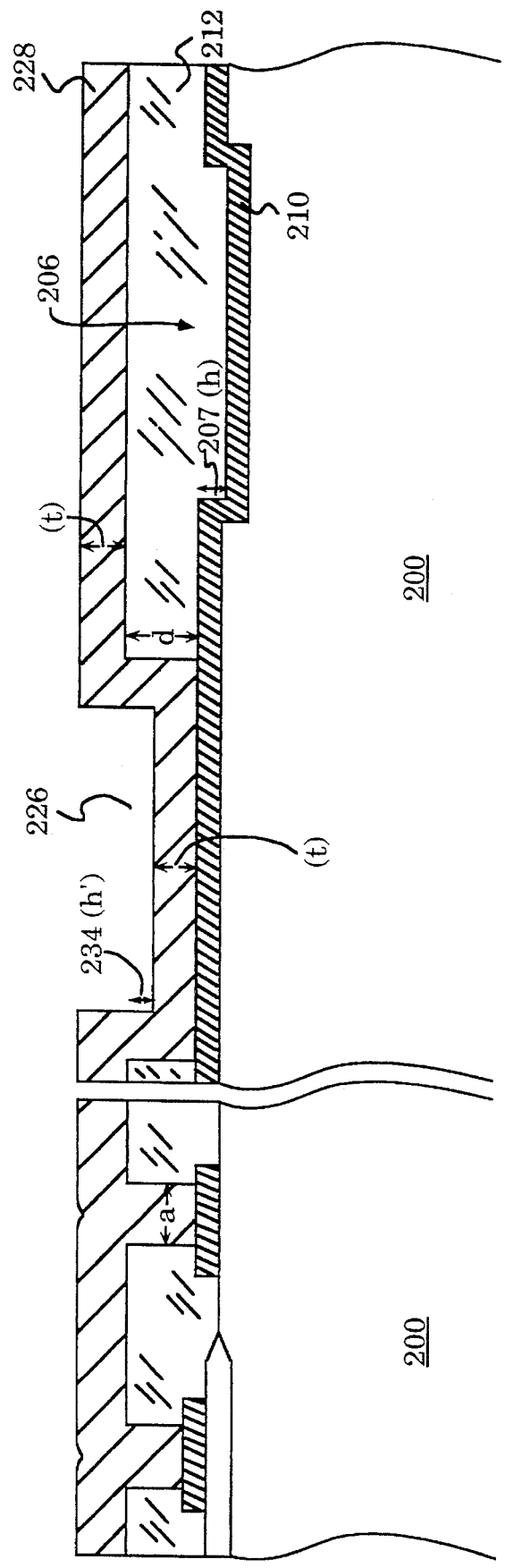
FIG. 2e is an illustration of a cross-sectional view showing the formation of a contact filling material on the substrate of FIG. 2d.

The next step according to the present invention is to simultaneously fill contact opening 220 and chemical-mechanical alignment mark opening 226 with a contact fill material, as shown in FIG. 2e. Contact fill material 228 is conformily deposited over the entire surface of substrate 200. Tungsten is the preferred contact fill material because it can be formed conformily by CVD which allows high aspect ratio contacts to be filled. Although tungsten is the preferred contact fill material, other conductive materials, including but not limited to, aluminum, copper, gold, polysilicon, and their alloys may be used if desired. Additionally, contact fill material may be a multilayer material, including an adhesion layer, a barrier layer, or a capping layer, such as tungsten silicide ($WSi_x$) titanium (Ti), titanium nitride (TIN), nickel (Ni), etc. Well-known chemical vapor deposition (CVD) techniques are preferably utilized to conformily deposit contact fill material 228.

According to the present invention, contact fill material 228 is deposited to a thickness (t) which is sufficient to fill the widest contact opening 220 and which is less than the thickness (d) of ILD 212 defining chemical-mechanical alignment mark opening 226. The difference (h') between the surface of ILD 2 12 and the surface of contact fill material 228 in the center of chemical-mechanical alignment mark opening 226 is chosen to be a difference which is sufficient for alignment of the stepper or alignment tool used. Since the preferred embodiment of the present invention utilizes a laser stepper, the difference (h') is approximately a ¼ multiple of the wavelength of the laser light used by the stepper for alignment. Preferably the difference (h') is approximately the same as the step height (h) 207 of original alignment mark 206. In the preferred embodiment of the present invention, the contact openings 220 are approximately 6000Å wide and contact fill material 228 is formed to a thickness of approximately 6800Å.

Figure 2F:
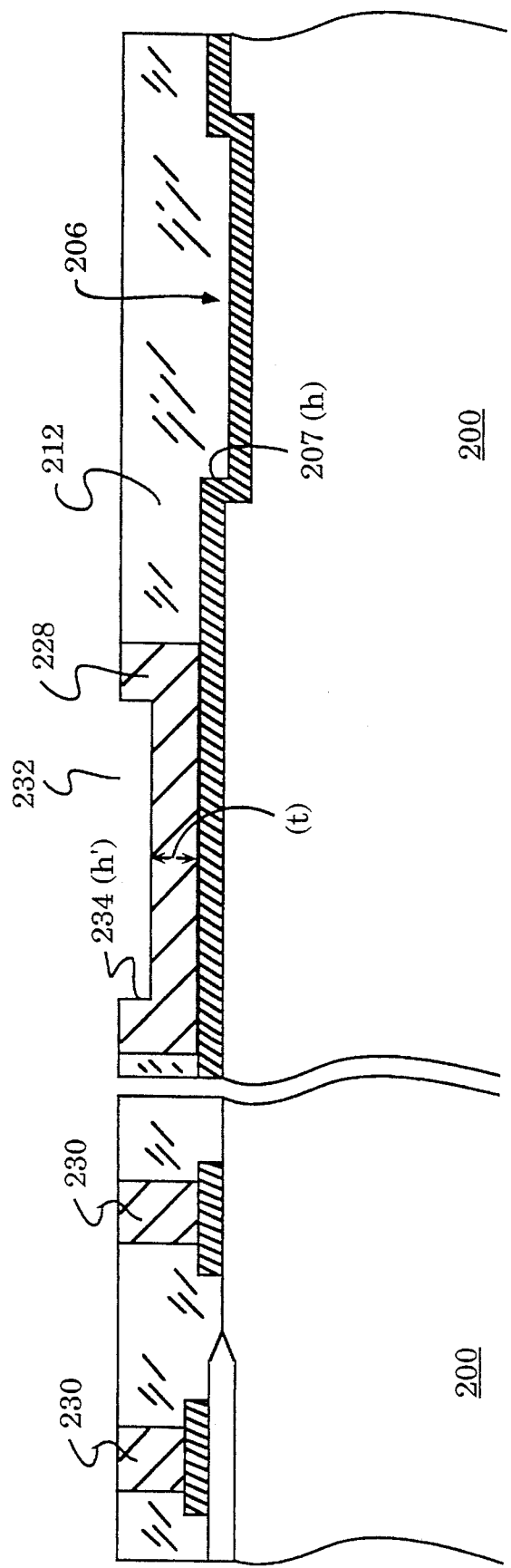
FIG. 2f is an illustration of a cross-sectional view showing the result of a chemical-mechanical polishing of the contact filling material from the substrate of FIG. 2e.

Next, according to the present invention, the top portion of contact fill material 228 is chemically-mechanically polished to remove contact film 228 from the top portion of ILD 212, as shown in FIG. 2f. Contact fill material 228 and ILD 212 are preferably chosen to have selectivity such that ILD 212 can provide an etch stop for the chemical-mechanical planarization step. This helps make the present invention manufacturable. After chemical-mechanical polishing, planar contact plugs 230 are formed over IC area 202 and a chemical-mechanical alignment mark 232 is formed in blank stepping field 204.

Chemical-mechanical alignment mark 232 includes a step height 234 having a height (h') which is of sufficient height for alignment. If a laser stepper is utilized, then step height 234 should have a height which is a quarter multiple of the wavelength of the laser light used for alignment, and preferably should be the same as step height (h) 207 of original alignment mark 206. It is to be appreciated that by utilizing a chemical-mechanical polishing process for plug formation in the present invention, contact fill material 228 within chemical-mechanical alignment mark opening 226 is not removed. In this way the step height (h') can be accurately predicted. Additionally, by forming plugs 230 with a blanket tungsten deposition and polish process high aspect ratio, planar plugs are formed, allowing the fabrication of modern high density ICs. It is to be appreciated that a new alignment mark or a chemical-mechanical alignment mark 232 has been formed which required no additional process steps (i.e., no additional deposition or etch steps are required). Thus, the present invention forms a second alignment mark 232 away from the first alignment mark 207 without increasing IC fabrication costs or complexity.

Figure 2G:
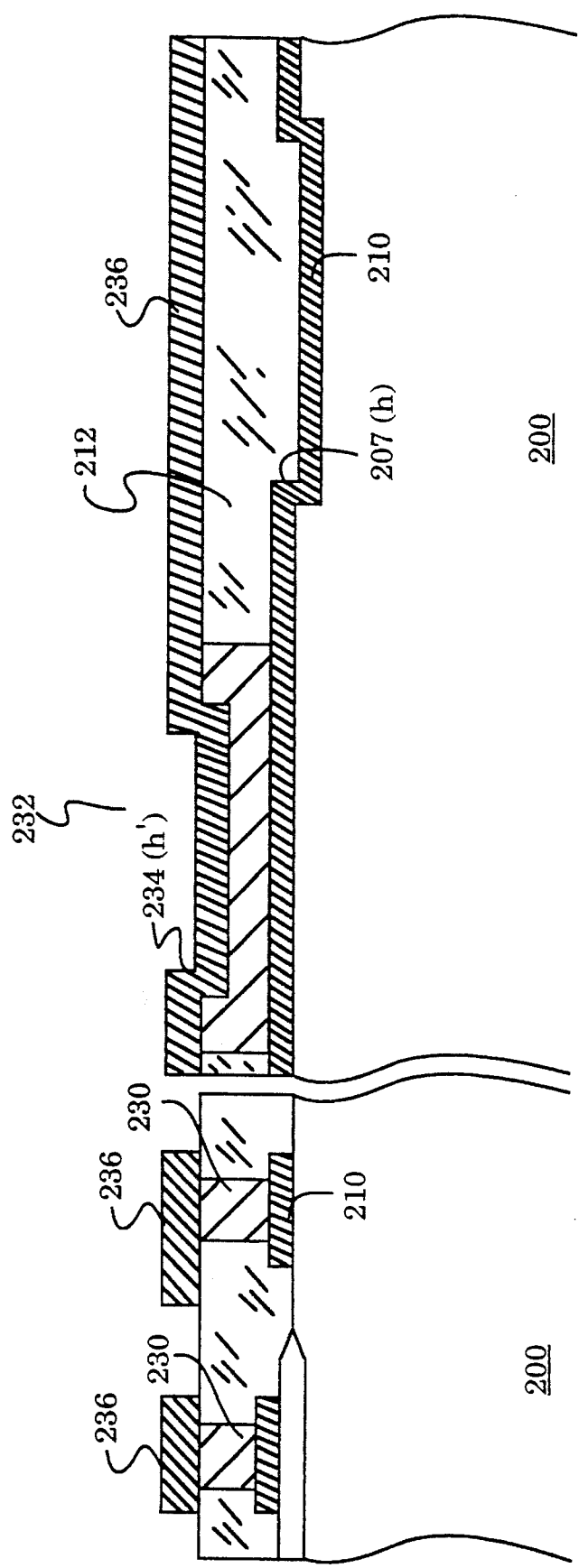
FIG. 2g is an illustration of a cross-sectional view showing the formation of a second interconnect layer on the substrate of FIG. 2f.

Next, according to the present invention, a second level of interconnection is formed as shown in FIG. 2g. A second interconnect layer 236, such as aluminum or its alloys, is blanket deposited over substrate 200 with well-known techniques such as sputtering or CVD. It is to be appreciated that other well-known conductive materials, such as, but not limited to, tungsten, gold, copper and their alloys, may be used as second interconnect layer 236. A photoresist layer is then formed over second interconnect layer 236. The photoresist layer is then masked by a second interconnect reticle aligned to step height 234 of chemical-mechanical alignment mark 232 replicated in second interconnect metal 236. After development, second interconnect layer 236 over IC area 202 is etched into individual interconnect lines with well-known techniques. It is to be appreciated that interconnect lines 236 are very planar because of planar plugs 230. It is also to be appreciated that alignment mark 232 should be formed in blank stepping field 204 away from step height 207 of alignment mark 206.

The present invention is now complete. It is to be appreciated that the present invention can be and is expected to be applied to the formation of additional alignment marks in still additional layers formed on the semiconductor substrate. What is important is to form an alignment mark opening during via or contact etches and then blanket deposit a metal to fill the alignment mark opening with a material to a thickness which is the desired step height less than the etched dielectric layer. A chemical-mechanical polish is then used to form planar contacts/vias plugs and a new alignment mark. In this way, a new alignment mark can be fabricated during via/contact plug processes without requiring additional deposition or etch steps.

Additionally, although the alignment marks of the present invention are described as being formed in blank stepping fields 204, they may be formed elsewhere on unused portions of substrate 200. For example, it is conceivable that they could be formed in the "scribe lines" between the various ICs. This would free up the blank stepping fields for active device fabrication. Additionally, although the present invention has been described with respect to a specific exemplary process, materials, and thicknesses, etc.; it is to be expected that one may vary such parameters in order to tailor the present invention to a specific process without varying from the scope of the present invention which is defined by the appended claims which follow.

Thus, a process for forming a chemical-mechanical alignment mark has been described which is compatible with global planarization techniques and which requires no additional etch or deposition steps.

I claim:

1. A method for forming a chemical-mechanical alignment mark comprising the steps of:

forming a first alignment mark having a first step height;

forming a first layer having a first thickness over said first alignment mark;

forming an opening in said first layer, away from said first alignment mark;

filling said opening with a second layer until said opening is filled to a second thickness less than said first thickness of said first layer, such difference between said first thickness and said second thickness forming a step height of said chemical-mechanical alignment mark.

2. The method of claim 1 wherein said second thickness is less than said first thickness by a quarter multiple of said first step height.

3. The method of claim 1 wherein said second thickness is approximately said first step height less than said first thickness.

4. A method of forming a chemical-mechanical alignment mark comprising the steps of:

forming an alignment mark in a substrate, wherein said alignment mark has a first step;

forming a dielectric layer over said alignment mark;

planarizing said dielectric layer to a first thickness;

etching an opening away from said alignment mark through said dielectric layer; and depositing a second thickness of a conductive layer over said dielectric layer and into said opening wherein said second thickness is less than said first thickness.

5. The method of claim 4 wherein said second thickness is less than said first thickness by a quarter multiple of said first step height.

6. The method of claim 4 wherein said second thickness is approximately said first step height less than said first thickness.

7. The method of claim 4 further comprising the step off chemically-mechanically polishing said conductive layer until said conductive layer is substantially removed from over said dielectric layer.

8. The method of claim 7 wherein said conductive layer comprises tungsten.

9. The method of claim 7 wherein said dielectric layer comprises silicon dioxide.

10. The method of claim 4 further comprising the step of:

after chemically-mechanically polishing said conductive layer, forming a second conductive layer over said dielectric layer and over said first conductive layer in said opening; and patterning said second layer over said dielectric layer into conductive interconnects.

11. A method of forming a chemical-mechanical polishing alignment mark comprising the steps of:

forming alignment mark in a silicon substrate, said alignment mark comprising a first step height;

forming a layer comprising polysilicon over said substrate, including said alignment mark;

forming a dielectric layer over said layer comprising polysilicon;

planarizing said dielectric layer to a first thickness above said layer comprising polysilicon;

etching an opening through said dielectric layer to said layer comprising polysilicon, wherein said opening is formed away from said alignment mark;

conformily depositing a conductive layer comprising tungsten over said dielectric layer and over said layer comprising polysilicon in said opening wherein said conductive layer is deposited to a second thickness, wherein said second thickness is less than said first thickness; and chemically-mechanically polishing said conductive layer so as to form a second alignment mark having a second step height in said conductive layer in said opening.

12. The method of claim 11 wherein said second thickness is less than said first thickness by a quarter multiple of said first step height.

13. The method of claim 11 wherein said second thickness is approximately said first step height less than said first thickness.

14. The method of claim 11 wherein said conductive layer is chemically-mechanically polished until said conductive layer is substantially removed from said dielectric layer.

15. The method of claim 11 wherein said conductive layer is chemically-mechanically polished until said second step height is approximately equal to said first step height.

16. The method of claim 14 further comprising the steps of:

forming a second conductive layer over said dielectric layer such that said second alignment mark is replicated in said second conductive layer;

patterning said second conductive layer utilizing said second alignment mark.

17. The method of claim 11 wherein a contact opening is formed over an IC area of said substrate simultaneous with said etching of said opening.

18. The method of claim 17 wherein said contact opening is simultaneous filled with said opening during said step ,of conformily depositing said conductive layer.

19. The method of claim 18 wherein a planar contact plug is formed from said filled contact opening simultaneously with said second alignment mark during said chemical-mechanical polishing step.

20. A method of forming an alignment mark, comprising the steps of:

forming a first layer;

globally planarizing said first layer;

etching an opening in said first layer; and filling said opening with a second layer of a different material, so that the height difference between said first layer and said second layer forms the alignment mark.

21. The method of claim 20, wherein said second layer is conformily deposited.

22. The method of claim 20, wherein said second layer is opaque.

23. The method of claim 20 further comprising the step of globally planarizing said second layer.

forming an opening in said first layer, away from said first alignment mark;

filling said opening with a second layer until said opening is filled to a second thickness less than said first thickness of said first layer, such difference between said first thickness and said second thickness forming a step height of said chemical-mechanical alignment mark.

* * * * *

UNITED STATES PATENT AND TRADEMARK OFFICE
CERTIFICATE OF CORRECTION

PATENT NO. : 5,503,962
DATED : April 2, 1996
INVENTOR(S) : Roger F. Caldwell

It is certified that errors appear in the above-identified patent and that said Letters Patent is hereby corrected as shown below:

In column 9 at line 33 please delete " off " and insert --of: --.

In column 10 at line 53-60 please delete the following:
" forming an opening in said first layer, away from said first alignment mark; filling said opening with a second layer until said opening is filled to a second thickness less than said first thickness of said first layer, such difference between said first thickness and said second thickness forming a step height of said chemical-mechanical alignment mark. "

Signed and Sealed this

Twenty-third Day of July, 1996

*Attest:*

BRUCE LEHMAN

*Attesting Officer*     *Commissioner of Patents and Trademarks*